United States Patent
Kanda et al.

(10) Patent No.: US 7,190,072 B2
(45) Date of Patent: Mar. 13, 2007

(54) RFID-CHIP HAVING RFID-TAG OR MAGNIFYING ELECTRODE

(75) Inventors: Naoya Kanda, Fujisawa (JP); Madoka Minagawa, Yokohama (JP); Kosuke Inoue, Fujisawa (JP); Hiroshi Homma, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 103 days.

(21) Appl. No.: 11/075,798

(22) Filed: Mar. 10, 2005

(65) Prior Publication Data

US 2005/0230791 A1    Oct. 20, 2005

(30) Foreign Application Priority Data

Mar. 31, 2004    (JP)    ............................ 2004-102112

(51) Int. Cl.
*H01L 23/48*    (2006.01)
*H01L 23/52*    (2006.01)
*B29C 65/00*    (2006.01)

(52) U.S. Cl. ...................... 257/737; 257/777; 257/778; 438/612; 438/613; 438/614; 156/73.1; 228/110.1

(58) Field of Classification Search ................ 257/737, 257/777, 778; 438/612, 613, 614; 156/73.1; 228/110.1

See application file for complete search history.

(56) References Cited

U.S. PATENT DOCUMENTS

| | | | | |
|---|---|---|---|---|
| 6,406,990 B1 * | 6/2002 | Kawai | .......................... | 438/612 |
| 6,523,734 B1 * | 2/2003 | Kawai et al. | ............. | 228/110.1 |
| 6,664,625 B2 * | 12/2003 | Hiruma | ...................... | 257/700 |
| 6,707,671 B2 * | 3/2004 | Yamashita et al. | .......... | 361/704 |
| 6,798,072 B2 * | 9/2004 | Kajiwara et al. | ............ | 257/778 |

FOREIGN PATENT DOCUMENTS

JP    2003-203946    7/2003

* cited by examiner

*Primary Examiner*—Long Pham
*Assistant Examiner*—Shrinivas H. Rao
(74) *Attorney, Agent, or Firm*—Antonelli, Terry, Stout and Kraus, LLP.

(57) ABSTRACT

When an RFID-tag is formed by joining a semiconductor chip (RFID chip) to an antenna consisting of a rolled metal foil or the like using ultrasonic waves, the pressure impressed to the semiconductor chip is suppressed to avoid the damage of the semiconductor chip. For this purpose, the present invention provides an RFID-tag 1 wherein gold bumps are joined to the metal foil by pressing the gold bumps formed on the semiconductor chip against an antenna member, and impressing ultrasonic waves; and the RFID-tag wherein a matte surface having a low glossiness is formed on the metal foil, or a surface having shallow rolling streaks is formed on the metal foil, and gold bumps are joined to the surface.

12 Claims, 5 Drawing Sheets

(D)

(E)

(D')

(E')

RFID-CHIP HAVING RFID-TAG OR MAGNIFYING ELECTRODE

INCORPORATION BY REFERENCE

The present application claims priority from Japanese application JP2004-102112 filed on Mar. 31, 2004, the content of which is hereby incorporated by reference into this application.

BACKGROUND OF THE INVENTION

The present invention relates to an RFID-tag wherein an RFID chip (Radio Frequency Identification Chip) having individual identification information (ID information) stored in a memory is electrically joined to an antenna.

PRIOR ART

One of a conventional method for manufacturing an RFID-tag is described in Patent Reference 1 (JP-A-2003-203946).

In the manufacturing method described in Patent Reference 1, a hard aluminum foil is overlaid on one surface of a PET (polyethylene terephthalate) film through an urethane-based resin adhesive, and these are laminated and adhered through heat lamination under the conditions of a temperature of 150° C. and a pressure of 5 kg/cm$^2$ to manufacture a metal-foil laminated material. Furthermore, the metal-foil laminated material is coated with the thermoplastic resin adhesive. It is also described that a semiconductor bare chip equipped with a gold bump is provided with ultrasonic waves, and heated to 150° C. to join to the metal foil of the metal-foil laminated material coated with the thermoplastic resin adhesive.

A commonly-used aluminum foil is manufactured by rolling aluminum through mill rolls. It has been known that the surface of the foil contacting the roll becomes glossy due to friction. When thinner foils are manufactured by rolling, a plurality of aluminum foils are overlapped before rolling; however, in the aluminum foils through this manufacturing process, it has been known that the surfaces contacting the mill rolls become bright surfaces (glossy surfaces), which has a high degree of brightness, and the surfaces contacting to each other becomes matte surfaces (non-glossy surfaces, for example, the surfaces rougher than the above-described glossy surfaces).

[Patent Document 1] JP-A-2003-203946

SUMMARY OF THE INVENTION

It was not considered that what kind of aluminum foil was preferable to use in an RFID-tag manufactured using the method described in Patent Reference 1.

The present inventors found that when a mixed layer between metals was formed by fractioning using ultrasonic vibration, the impressing load to a non-glossy surface could be lower than the impressing load to a glossy surface formed when an aluminum-based material is rolled.

Specifically, the object of the present invention is to improve reliability by reducing the impressed load to make it difficult to damage an RFID-tag.

Although there are a plurality of means for achieving the above-described object, typical ones are as follows:
(1) A structure joined by pressing the gold bumps of a semiconductor chip against the non-glossy surface of a metal foil, and impressing ultrasonic waves; and (2) A structure joined by pressing the gold bumps of a semiconductor chip against a surface of a metal foil having shallow rolling streaks, and impressing ultrasonic waves.

Since these structures enable joining even if the load is small, and hardly damage the RFID-chip, reliability can be improved.

Especially, it is effective from the point of view of productivity to use a resin film, such as a polyethylene terephthalate film and a polyethylene naphthalate film, as the base material for supporting a metal foil to be an antenna, because the load can be reduced, and the ultrasonic oscillating time can be shortened.

According to the present invention, since the RFID-chip is hardly damaged, the reliability of the RFID-chip can be improved.

Other objects, features and advantages of the invention will become apparent from the following description of the embodiments of the invention taken in conjunction with the accompanying drawings.

PREFERRED EMBODIMENTS OF THE INVENTION

Embodiments suitable for manufacturing an RFID-tag according to the present invention will be described below.

EXAMPLE 1

Figure 1:
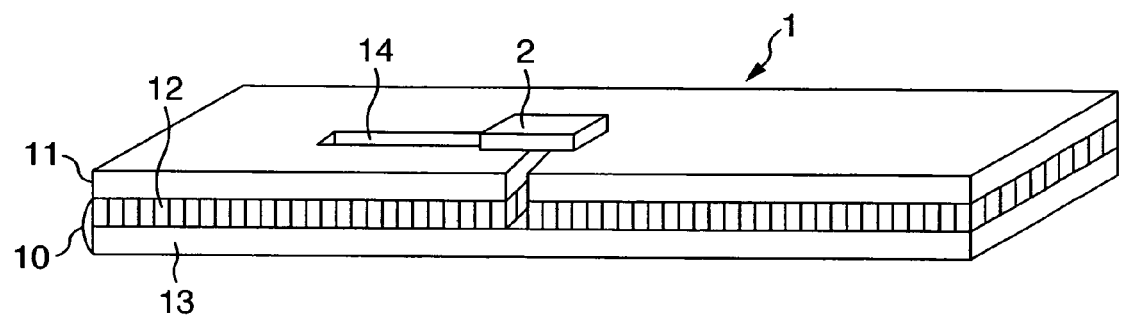
FIG. 1 is a diagram showing the structure of an RFID-tag.

FIG. 1 is a perspective view showing an RFID-tag.

The RFID-tag 1 has a semiconductor chip 2, a metal-foil laminate 10, and a resin layer 11 to be a protective layer and also an etching resist.

The semiconductor chip 2 has a size of 400 μm square, and is provided with four round bumps each of a radius of 63 μm in 300-μm pitch on the functional surface.

In the metal laminate 3, a metal foil (aluminum foil) 12 fabricated to be able to transmit and receive electric waves of 2.45 GHz is adhered on a PET film 13 (a film formed by stretching polyethylene terephthalate) that becomes the base material of the metal foil. The metal foil 12 has a rectangular shape of a structure provided with an L-shaped gap.

Figure 4:
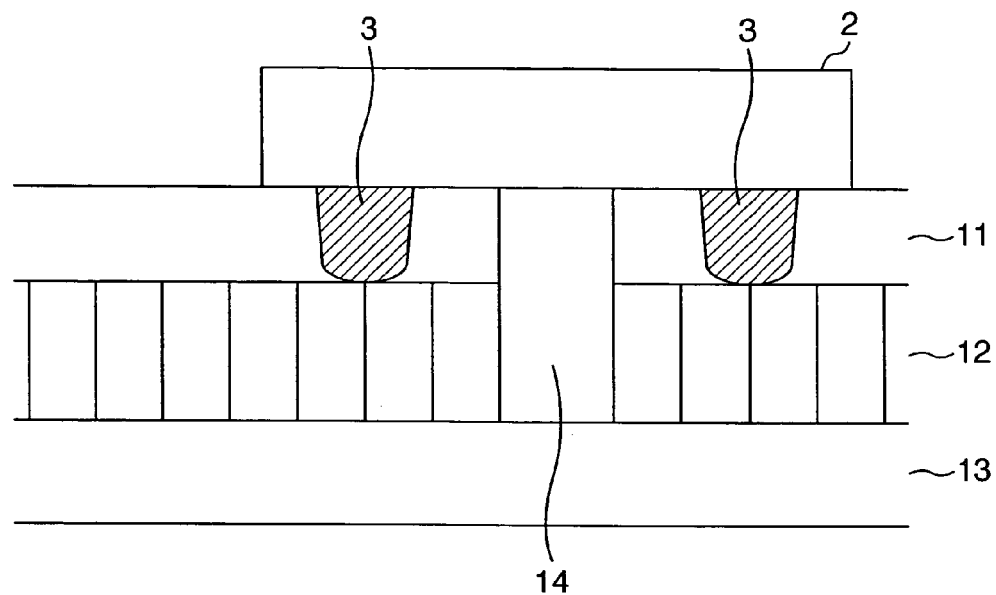
FIG. 4 is an enlarged diagram of the RFID-tag in the semiconductor-chip mounting portion.

FIG. 4 shows the joined state. The gold bumps are electrically joined with the metal foil, and the metal layer 11 surrounds the gold bumps of the semiconductor chip.

Figure 2:
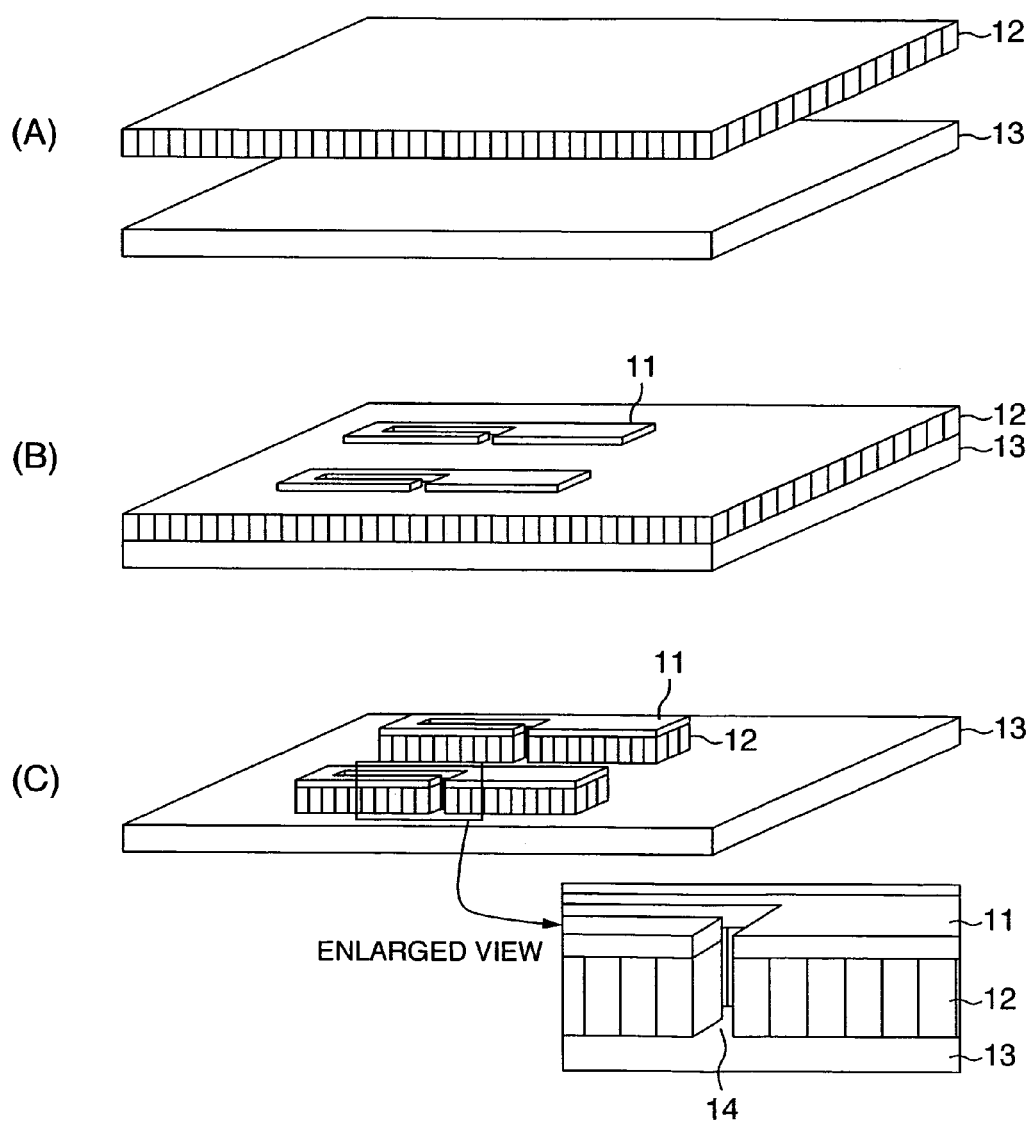
FIG. 2 is a diagram showing the manufacturing flow of the RFID-tag.
Figure 3:
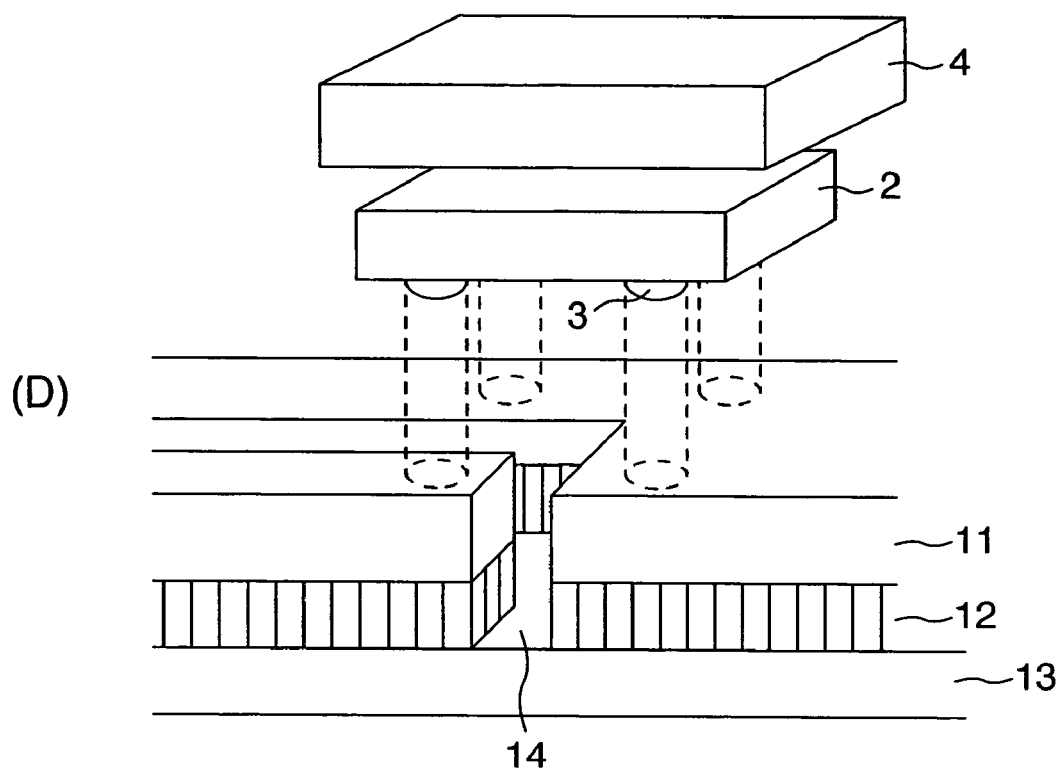
FIG. 3 is a diagram showing the manufacturing flow of the RFID-tag.
Figure 3:
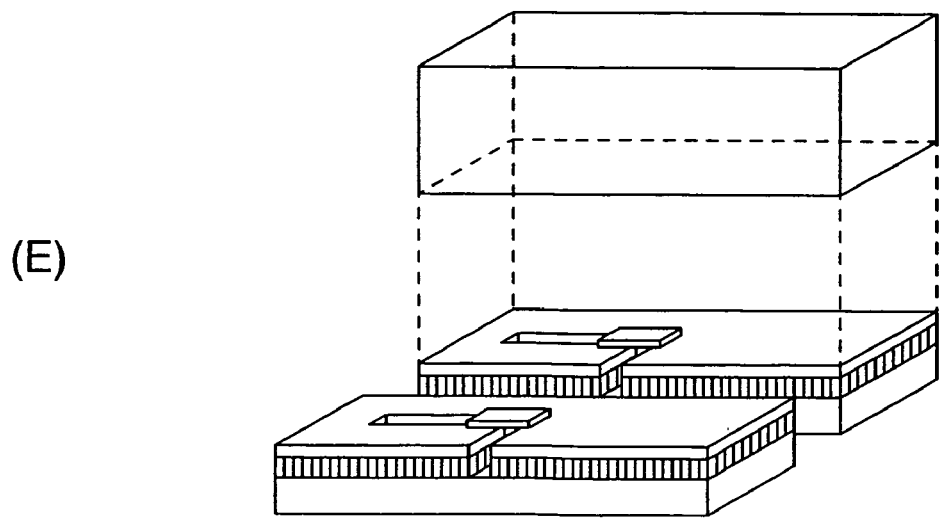

FIGS. 2 and 3 show the manufacturing flow of the RFID-tag.

The RFID-tag of FIG. 1 is manufactured by sequentially carrying out (A) a step for fabricating a metal-layer laminate, (B) a step for forming a resin layer, (C) a step for fabricating an antenna pattern, (D) a step for ultrasonic mounting, and (E) a step for slicing into inlets.

(A) Step for Fabricating Metal-Layer Laminate

First, an aluminum foil 12 of a thickness of 20 μm and a PET film 13 of a thickness of 25 μm are provided as base materials.

By disposing an aluminum foil 12 of a thickness of 20 μm through an adhesive on one side of the PET film 13 (upper surface in the figures), and thermally laminating the glossy surface of the aluminum foil 12 to the PET film 13 under the conditions of a temperature of 150° C. and a pressure of 5 kg/cm², a metal-foil laminate 10, which is a laminate wherein a metal foil is adhered on a PET film, i.e., a resin layer, is formed.

(B) Resin Layer Forming Step

A resin layer 11 of a thickness of about 4 to 6 μm patterned to have a desired antenna shape is formed using gravure printing on the surface of the aluminum foil 12 of the metal-foil laminate 10 fabricated in Step (A). For this resin layer 11, a material that functions as resist in the formation of the aluminum foil 12 by etching in the next step is used.

The resin layer 11 can be formed not only by gravure printing, but also by general photo-etching technique, wherein an optically curing resin is applied on the surface of the aluminum foil 12 of the metal-foil laminate 10 instead of patterning, the optically curing resin is cured to a specific pattern using a mask, and the portions other than the specific pattern are removed. The applying thickness is adjusted corresponding to the size and shape of the bumps of the chip to be mounted.

Although not adopted in this embodiment, if sprocket holes are formed in the PET film 13 so as to interleave the antenna pattern of the resin layer 11, or the sprocket holes are previously formed and the pattern of the resin layer 11 is formed between them, reel-to-reel production can be possible. When sprocket holes are formed in this step, it is preferable that two lines of resin layers 11 independent from the antenna pattern is formed on the PET film 13 so as to interleave the antenna pattern of the resin layer 11, and the metal-foil laminate 10 is punched from the side of the resin layer 11 using a puncher. This is because the resin layer 11 functions as the lubricant of the blade of the puncher.

(C) Antenna-Pattern Manufacturing Step

Next, the region of the aluminum foil on the area exposed from the resist of the antenna pattern of the resin layer 11 is removed using etching. By this etching, the antenna is formed. This etching is performed by exposing the region of the aluminum foil exposed from the etching resist pattern 7 to an aqueous solution of iron (III) chloride, which is the etchant, under the temperature condition of 50° C.

(D) Ultrasonic Mounting Step

The RFID-chip 2 is aligned to the predetermined mounting location of the laminate of the metal-foil laminate 10 and the resin layer 11 wherein the antenna pattern of the metal foil 12 is formed on the PET film 13 to be a base material.

In this embodiment, the corner of the L-shaped gap portion 14 formed on the metal foil 12 and the resin layer 11 is disposed so as to be the center of the semiconductor chip 2. Specifically, in this structure, four gold bumps 3 interleave the gap portion 14. In this arrangement, by disposing counter bumps for signals on the joining region of gold bumps 3 whose two sides are surrounded by the gap portion, the freedom of alignment can be improved, because electrical connection can be secured even if the counter bumps for signals are somewhat misaligned when the bumps for signals are disposed in the diagonal direction.

Next, the gold bumps 3 are pressed against the resin layer 11 by applying pressure, a horn 4 of 500-μm square is put on the upper surface of the RFID-chip 2, and ultrasonic waves 5 are applied to the surface for mounting the gold bumps.

Due to the oscillation of the ultrasonic waves, the gold bumps 3 push the resin layer 11 away, and contact and is joined to the aluminum foil 12. The temperature at this time is set to room temperature, which is lower than the glass transition temperature of the PET film 13. The ultrasonic waves are applied for about 0.5 second under a load of 0.2 kg, a frequency of 63.5 kHz, and an output of 2 W.

Although ultrasonic waves are impressed at room temperature in this embodiment, they can be impressed at an elevated temperature if it is not higher than the glass transition temperature.

(E) Step for Slicing into Inlets

Next, the resin layer 11 is sliced into RFID-tags (inlets) each carrying a semiconductor chip 2 by lowering from a position above the resin layer 11, a metal frame 20 having substantially the same size as the pattern of the resin layer 11 and the metal foil 12, that is the antenna pattern, and whose lower end is a sharp edge. An inlet is a form wherein an antenna (pattern of the metal foil 12) is fixed to a semiconductor chip 2 as described above, and it is the step to divide a plurality of the forms formed on the major surface of the PET film 13 individually.

Although a PET film 13 is used as the resin base material to constitute the laminated material 1 in the above-described embodiment, a PEN film (film produced by stretching a polyethylene naphthalate film), or a mixed film of these (film produced by stretching a mixed-material of PET and PEN) can also be used instead of the PET film 13. In this case, since the glass transition temperature of general polyethylene naphthalate is about 100° C. to 120° C., a temperature lower than this temperature is used.

From the above embodiment, the followings can be known.

(1) In an RFID-tag wherein gold bumps are joined to a metal foil formed by pressing a semiconductor chip having gold bumps against a rolled metal foil (e.g. extended flatly on a base member) by a mill roll and impressing ultrasonic waves thereto, if the structure having the gold bumps of a semiconductor chip joined to the matte surface, which is the surface of the metal foil having a low glossiness is used, the force applied to press the semiconductor chip against the metal foil can be small, and the RFID-chip is hardly damaged.

When a metal foil has a bright surface having a high glossiness, the matte surface must be selectively used, and more significant effect can be obtained.

(2) In an RFID-tag wherein gold bumps are joined to a metal foil formed by pressing a semiconductor chip having gold bumps against a rolled metal foil by a mill roll, and impressing ultrasonic waves, if the structure joined by pressing the gold bumps of a semiconductor chip against a surface of a metal foil having shallow rolling streaks is used, the force applied to press the semiconductor chip against the metal foil can also be small, and the RFID-chip is hardly damaged.

When the metal foil has a surface having deep rolling streaks, a surface having shallow rolling streaks must be selectively used, and the more significant effect can be obtained.

As preferred embodiments for the structures of (1) and (2), the following items can be said.

a. When a resin layer is formed on the surface of the metal foil carrying no semiconductor chips, if joining is performed by impressing ultrasonic waves at a temperature lower than the glass transition temperature of the resin layer, the deformation of the resin layer can be suppressed, and the reliability of joining the gold bumps to the metal foil is improved.
b. The joining of the above item a performed in an environment of room temperature is preferable from the point of view of manufacturing, because no temperature control is required.
c. If aluminum or aluminum-based alloys are used as the metal foil, the temperature required for joining can be significantly lowered.
d. The use of polyethylene terephthalate or polyethylene naphthalate as the resin layer of the above item a is preferable, because the large deformation seen in conventional resin layers can be suppressed.
e. Even when the resin layer 11 is formed on the surface of the metal foil carrying semiconductor chips, the same effect can be obtained.
f. When a resin layer 11 is formed on the surface of a metal foil carrying semiconductor chips using a printing method to the shape of an antenna (or magnifying electrode) on the metal foil, if printing is performed on the bright surface, in other word, the surface having thick rolling streaks, the resin layer 11 runs along the rolling streaks produced when the aluminum-based metal foil is formed, and the accuracy of the shape is hardly maintained. Whereas, if the resin layer 11 is printed on the non-glossy surface, the running directionality of the resin layer 11 is reduced; therefore, the accuracy of the shape can be easily maintained.

EXAMPLE 2

Figure 6:
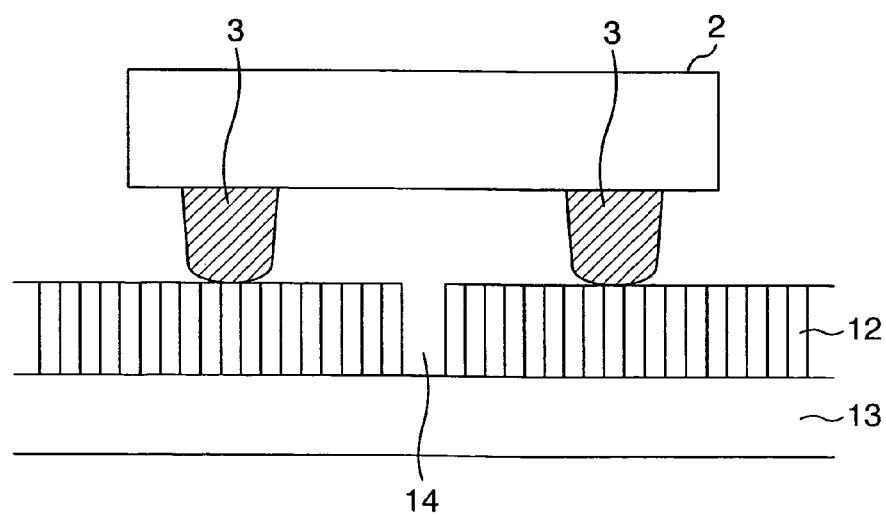
FIG. 6 is an enlarged diagram of the RFID-tag in the semiconductor-chip mounting portion.
Figure 5:
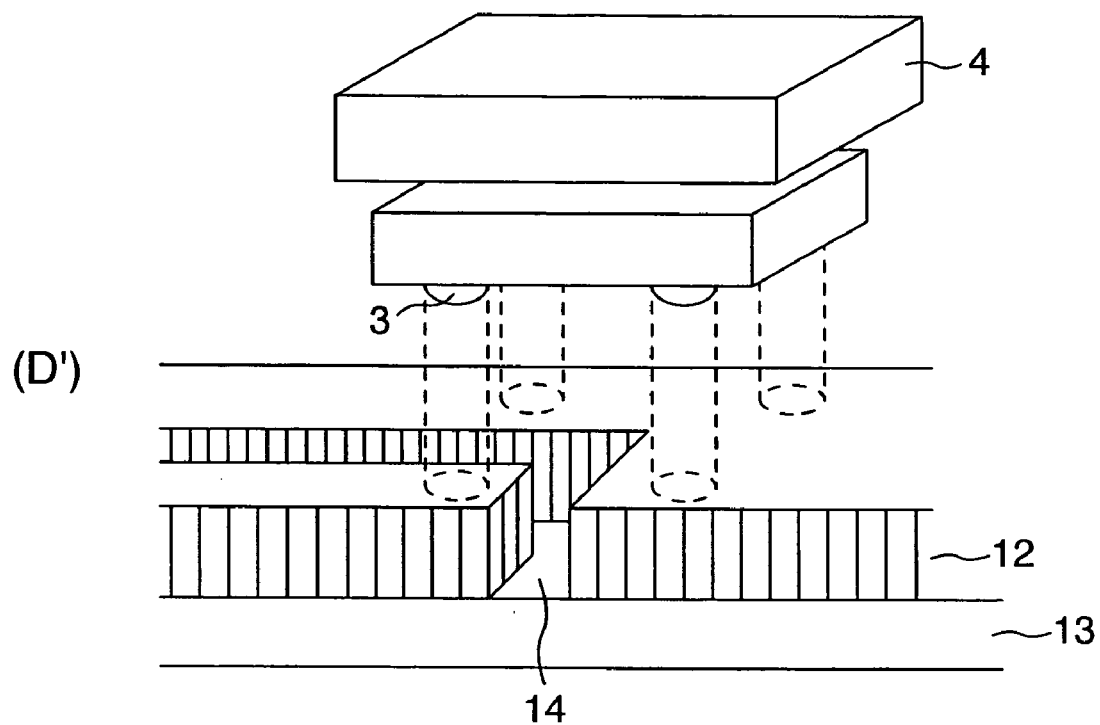
FIG. 5 is a diagram showing the manufacturing flow of the RFID-tag.
Figure 5:
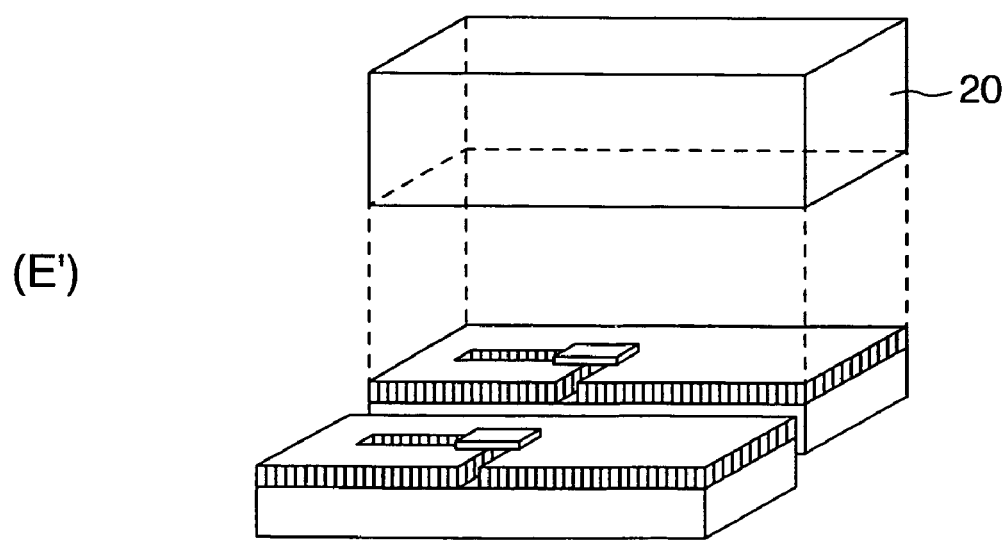

FIGS. 5 and 6 show other examples.

Although the resin layer 11 of the antenna pattern is left remained in Step (C) of Example 1, in this example the resin layer 11 is removed as shown in FIGS. 5 and 6. The removal is performed using a method used in an ordinary photo-etching step. According to this method, a structure of FIG. 1 except that no resin layer 11 is present can be formed.

Therefore, the manufacturing steps (C) to (E) in Example 1 are changed to (C') to (E').

(C') Antenna-Pattern Manufacturing Step

The region of the aluminum foil on the area exposed from the resist of the antenna pattern of the resin layer 11 is removed using etching. By this etching, the antenna is formed. This etching is performed by exposing the region of the aluminum foil on the area exposed from the etching resist pattern 7 to an aqueous solution of iron (III) chloride, which is the etchant, under a temperature condition of 50° C.

Thereafter, the pattern of the resin layer 11 allowed to function as the resist is removed using a resist-removing agent.

The semiconductor chip 2 is aligned to the predetermined mounting location of the laminate of the metal-foil laminate 10 wherein the antenna pattern of the metal foil 12 is formed on the PET film 13 to be a base material.

In this embodiment, and the corner of the L-shaped gap portion 14 formed on the metal foil 12 is disposed so as to be the center of the semiconductor chip 2. Specifically, in this structure, four gold bumps 3 interleave the gap portion 14. In this arrangement, by disposing counter bumps for signals on the joining region of gold bumps 3 whose two sides are surrounded by the gap portion, the freedom of alignment can be improved, because electrical connection can be secured even if the counter bumps for signals are somewhat misaligned when the bumps for signals are disposed in the diagonal direction.

Next, as FIG. 5 (D') shows, the gold bumps 3 are pressed against the metal foil 12 by applying pressure, a horn 4 of 500-μm square is put on the upper surface of the RFID-chip 2, and ultrasonic waves 5 are applied to the surface carrying no mounted gold bumps.

Due to the oscillation of the ultrasonic waves, the gold bumps 3 push the resin layer 11 away, and contact and is joined to the aluminum foil 12. The temperature at this time is set to room temperature, which is lower than the glass transition temperature of the PET film 13. The ultrasonic waves are applied for about 0.5 second under a load of 0.2 kg, a frequency of 63.5 kHz, and an output of 2 W.

Although ultrasonic waves are impressed at room temperature in this embodiment, they can be impressed at an elevated temperature if it is not higher than the glass transition temperature.

(E') Step for Slicing Into Inlets

Next, the metal foil 12 is sliced into RFID-tags (inlets) each carrying a semiconductor chip 2 by lowering from a position above the metal foil 12, a metal frame 20 having substantially the same size as the pattern of the metal foil 12, that is the antenna pattern, and whose lower end is a sharp edge. Thereby, for example, as FIG. 5 (E') shows, the pattern of the metal-foil 12 formed on the PET film 13 is divided into two RFID-tags each carrying a semiconductor chip 2.

FIG. 6 shows an enlarged view of an RFID-tag on the semiconductor-chip mounting area.

Since the resin layer is removed in Step (C) of FIG. 2, there is a gap between the semiconductor chip 2 and the metal foil 12. When the reliability of joining must be raised, the gap can be filled with a resin.

Example 2 is a structure when the resin layer between the metal foil and the semiconductor chip is removed from the structure of Example 1, and is the same as Example 1 except that the gold bumps are directly pressed against the metal foil without intervening the resin layer.

EXAMPLE 3

Although a PET (polyethylene terephthalate) film or a PEN (polyethylene naphthalate) film is used in Examples 1 and 2, paper is used instead of these films in Example 3.

Example 3 is entirely the same as Examples 1 and 2, except that the PET film 13 is changed to paper.

However, although paper has not glass transition point (temperature), a temperature that does not cause deformation or deterioration of the adhesive for adhering the paper to the metal foil is used. Therefore, considering the aspect that no special heating apparatus is required, room temperature is preferable.

While we have shown and described several embodiments in accordance with the present invention, it is understood that the same is not limited thereto but is susceptible of numerous changes and modifications as know to those skilled in the art, and we therefore do not wish to be limited to the details shown and described herein but intend to cover all such changes and modifications as are encompassed by the scope of the appended claims.

The invention claimed is:

1. An RFID-tag comprising gold bumps and a rolled metal foil joined by pressing a semiconductor chip provided with said gold bumps against said rolled metal foil, and by applying ultrasonic vibrations, wherein, when said metal foil has a matte surface of a low glossiness, said superconducting chip provided with said gold bumps is joined to said matte surface and wherein, a resin layer is formed on the surface of said metal foil that does not carry said semiconductor chip, and wherein said semiconductor chip provided with said gold bumps is joined by ultrasonic bonding at a temperature not higher than the glass transition temperature of said resin layer.

2. The RFID-tag according to claim 1, wherein, said metal foil has a bright surface having a high glossiness.

3. An RFID-tag comprising gold bumps and a rolled metal foil joined by pressing a semiconductor chip provided with said gold bumps against said rolled metal foil, and by applying ultrasonic vibrations, wherein, when said metal foil has a surface having shallow rolling streaks, said semiconductor chip provided with said gold bumps is joined to said surface having shallow rolling streaks, wherein, a resin layer is formed on the surface of said metal foil that does not carry said semiconductor chip, and wherein, said semiconductor chip provided with said gold bumps and said metal foil are joined by ultrasonic bonding at a temperature not higher than the glass transition temperature of said resin layer.

4. The RFID-tag according to claim 1, wherein, said metal foil has a surface having deep rolling streaks.

5. The RFID-tag according to claim 1, wherein, said metal foil is an aluminum foil or an aluminum-based alloy foil.

6. The RFID-tag according to claim 1, wherein, said resin layer is composed of polyethylene terephthalate or polyethylene naphthalate.

7. An RFID-tag comprising gold bumps and a rolled metal foil joined by pressing a semiconductor chip provided with said gold bumps against a resin layer formed on said rolled metal foil, and by applying ultrasonic vibrations, wherein, said metal foil has a matte surface having a low glossiness, and said resin layer is formed on said matte surface and wherein, said semiconductor chip provided with said gold bumps and said rolled metal foil are joined by ultrasonic bonding at room temperature.

8. The RFID-tag according to claim 7, wherein, said metal foil has a bright surface having a high glossiness.

9. An RFID-tag comprising gold bumps and a rolled metal foil joined by pressing a semiconductor chip provided with said gold bumps against a resin layer formed on said rolled metal foil, and by applying ultrasonic vibrations, wherein, said metal foil is provided with a surface having deep rolling streaks and a surface having shallow rolling streaks, said resin layer is formed on said surface having shallow rolling streaks, wherein said semiconductor chip provided with said gold bumps is joined to at least one of said surface having deep rolling streaks and said surface having shallow rolling streaks, wherein, said resin layer is formed on said surface of said metal foil that does not carry said semiconductor chip, and wherein said semiconductor chip provided with said gold bumps is joined by ultrasonic bonding at a temperature not higher than the glass transition temperature of said resin layer.

10. The RFID-tag according to claim 9, wherein, said metal foil has a surface having deep rolling streaks.

11. The RFID-tag according to claim 9, wherein, said joining is performed in an environment of room temperature.

12. The RFID-tag according to claim 7, wherein, said metal foil is an aluminum foil or an aluminum-based alloy foil.

* * * * *